BISTABLE TWO OR THREE TERMINAL DOUBLE INJECTION SWITCHING ELEMENT

Filed May 31, 1967

Morris Braunstein,
Rainer Zuleeg,
INVENTORS.
BY.

W H McAllister Jr

ATTORNEY.

United States Patent Office 3,454,847

Patented July 8, 1969

3,454,847

BISTABLE TWO OR THREE TERMINAL DOUBLE INJECTION SWITCHING ELEMENT

Rainer Zuleeg, Huntington Beach, and Morris Braunstein, Los Angeles, Calif., assignors to Hughes Aircraft Company, Culver City, Calif., a corporation of Delaware Filed May 31, 1967, Ser. No. 642,562
Int. Cl. H01l 11/00, 3/12
U.S. Cl. 317—235 9 Claims

ABSTRACT OF THE DISCLOSURE

A thin-film semiconductor device exhibiting negative resistance and double injection in which a thin film of vapor-deposited silicon of no more than 100 microns in thickness is disposed on a P or N type silicon layer of from 2 to 5 ohm-centimeters in resistivity disposed on P+ or N+, respectively, silicon substrate.

This invention relates to electronic devices and especially to solid state electronic devices exhibiting negative resistance. More particularly, the invention relates to a solid state thin film electronic device exhibiting negative resistance in a thin film of semiconductor material.

Negative resistance has been observed previously in solid state semiconductor devices such as the tunnel diode described by Leo Esaki in an article in the Physical Review for January 1957 on pages 603–604 entitled "New Phenomenon in Narrow Germanium P–N Junctions." The tunnel diode exhibits a negative resistance region in its current-voltage characteristics when forwardly biased; it employs a P–N junction in a semiconductor body which is degeneratively doped on both sides of the junction. In U.S. Patent No. 3,319,137, issued May 9, 1967 (Morris and Arthur I. Braunstein, Thin Film Negative Resistance Device), a thin film negative resistance device is described which distinguishes, inter alia, over prior negative resistance devices by being thin film in form in contrast with the bulk-type semiconductor negative resistance devices as emplified by the aforementioned tunnel diode. The thin film device of the above-referred to patent comprises thin films of a metal oxide and a semiconductor disposed between metallic electrodes and depends on tunnel emission from the oxide film into the semiconductor film.

The present invention relates to a solid state device including a thin film of semiconductor material in which negative resistance is observed at both room and liquid nitrogen temperatures due to double injection. While double injection behavior has been observed in bulk crystalline samples of silicon and other materials, double injection has not been observed in thin semiconductor films until the present invention. The bulk semiconductor devices of the known prior art exhibiting double injection have utilized semiconductor samples ranging from approximately one hundred microns to several thousand microns in order to insure that the ambipolar diffusion length be much less than the sample length. In other words, in these proir art double injection devices, the semiconductor body in which double injection occurred had to be made thick enough to prevent the flow of diffusion current therethrough by reason of adjacent semiconductor regions in which current flow by diffusion was intentionally dominant. Indeed, until the present discovery, it has not been believed possible for this reason to obtain double injection in a semiconductor film less than one hundred microns in thickness.

The present invention achieves double injection and hence negative resistance in a thin film semiconductor device by evaporating a film of silicon, for example, onto a layer of relatively high resistivity silicon epitaxially grown on a low resistivity silicon wafer. Aluminum, for example, is vapor-deposited onto the vapor-deposited silicon film for the purpose of making electrical contact thereto. Both N-type and P-type devices may be fabricated in accordance with the invention.

The invention will be described in greater detail by reference to the drawings in which.

Figure 1:
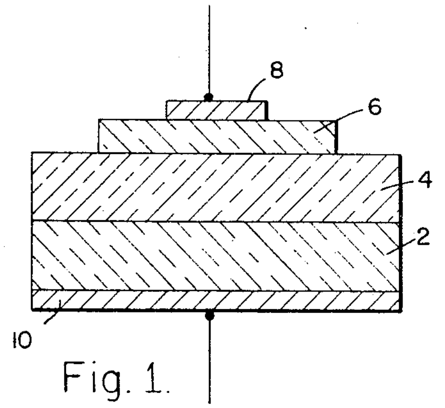
FIGURE 1 is a cross-sectional, elevational view of a two-terminal device according to the invention.

With reference now to FIGURE 1, a two-terminal negative resistance device is shown comprising a low resistivity silicon layer 2 which may be of P-type conductivity, for example, on which is formed an epitaxially grown layer 4 of higher resistivity silicon, likewise typically of P-type conductivity, and on which is a vapor-deposited thin film 6 of polycrystalline silicon. Because of its low resistivity, the silicon layer 2 is usually identified as a "P+" layer which is a term well known in the art to indicate low resistivity. The resistivity of the P+ silicon substrate member 2 does not appear to be critical and may be stated as simply lower than the resistivity of the epitaxial silicon layer 4. Typically, the resistivity of the P+ layer 2 may be about .008 to about .015 ohm-centimeter. The silicon substrate member 2 may be prepared by dicing from a wafer of silicon having the desired conductivity type and resistivity. Typically, the silicon substrate member 2 may be about .010 inch thick. Of prime importance is the resistivity of the P-type epitaxial silicon layer 4 which is about 2 to 5 ohm-centimeters.

The layer 4 of P-type silicon is epitaxially grown upon the silicon substrate member 2 by the simultaneous reduction in hydrogen of boron trichloride and silicon tetrachloride at a temperature of from 1200°–1300° C., for example. Such epitaxial growth procedures are well known and are descibed in greater detail by H. C. Theuerer in the Journal of the Electrochemical Society (1961, vol. 108 at page 649) and by A. Mark in the same journal (1961, vol. 108 at page 880). The thickness of this epitaxial silicon layer 4 may be about 5 microns, for example.

The thin silicon film 6 may be formed by evaporating silicon from a carbon crucible by radio frequency heating in a vacuum system in which the sub-assembly, comprising the substrate member 2 and the epitaxially grown silicon layer 4, is disposed and maintained at a temperature of from 500°–600° C., for example. A typical evaporation rate is about one micron per minute. The resulting deposited film is polycrystalline and of from $10^4$ to $10^5$ ohm-centimeters in resistivity.

The final step is to provide contacts to the device which may be achieved by vapor-depositing a metal such as aluminum or gold onto the thin silicon film 6 to form a metallic contact layer 8 thereon or by antimony diffusion or ion implantation to form an N+ contact and by vapor-depositing and alloying gold onto the "back" surface of the silicon substrate member 2 to form a metallic contact layer 10 thereon.

As mentioned previously, the resistivity of the P epitaxial layer 4 is of prime importance. Experiments with devices either not having this layer 4 at all or having a layer of epitaxial material of a resistivity lower than 2 to 5 ohm-centimeters showed only normal diode behavior and no negative resistance or failed to work altogether. Apparently the P layer 4 supplies a limited quantity of "holes" for the double injection mechanism.

Figure 4:
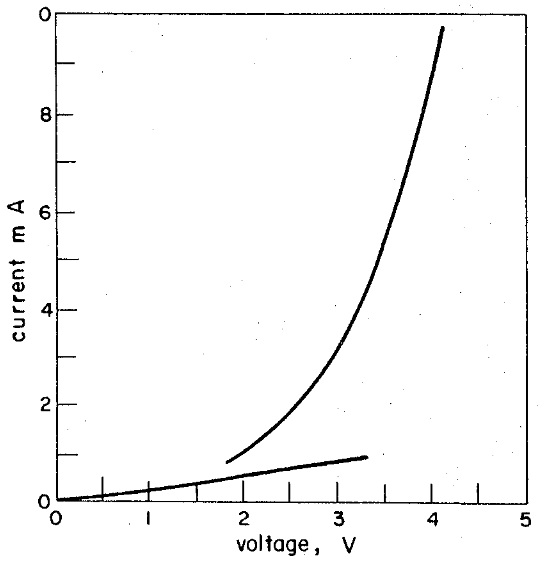
FIGURES 3 through 5 are graphical representations of typical volt-ampere characteristics of devices according to the invention.
Figure 3:
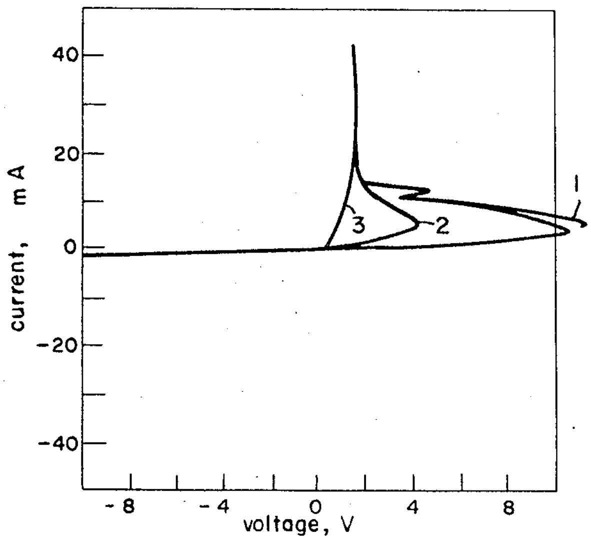

FIGURE 3 shows the volt-ampere characteristic of a typical diode such as shown in FIGURE 1 at room temperature. Reference point 1 on the curve is for no illumination of the diode while points 2 and 3 show the effects of increased light levels. FIGURE 4 shows the forward characteristic of the same diode at liquid nitrogen temperature. The curves shown in FIGURES 3 and 4 are all plotted with the metallic contact member 8 biased negatively for forward current. It has been observed that the voltage threshold for the onset of negative resistance may vary from a few volts to approximately 25 volts for a given device. It has also been found that this voltage threshold is sensitive to thermal cycling during the mounting of the device as on a header and as during the bonding of leads for testing. However, finished diodes have been found stable after heating to temperatures in excess of 300° C. The negative resistance of such diodes has been found to be stable and well-behaved in the sense that resistive load lines calculated from the volt-ampere characteristics have been used to produce stable current oscillations ranging in frequency from 10 kHz. to 1 mHz. Monostable and bistable switching action in response to both voltage and light pulses have also been observed. When operated in the bistable switching mode, the diodes can be switched from the low current to the high current state by light with energy greater than the band gap of the silicon material. Using a resistive load line of 1000 ohms, diodes such as shown in FIGURE 1 have been electrically switched in 40 nanoseconds. Using a light pulse from a flash lamp with a pulse width of 1–2 microseconds, a rise time of 40 nanoseconds was observed but with longer decay times approaching the order of 2 microseconds. It should be appreciated that with respect to measurements made to date, the switching speed has been limited by the 40 nanoseconds response time of the amplifiers and oscilloscopes used for making the measurements with conventional equipment. With reference to FIGURE 4, the behavior of the negative resistance region with temperature is rather complicated. As the temperature is reduced below room temperature, both the voltage and current at the negative resistance threshold increase reaching a maximum at approximately 120° K. Thereafter, the threshold voltage and current decrease, reaching values at 78° K. which are less than those at room temperature. Since the high current state shows less temperature dependence than the low current state, the negative resistance swing also goes through a maximum as temperature is reduced and is much less at 78° K. than at room temperature. The characteristic of FIGURE 4 (at 78° K.) shows that the current is proportional to the square of the voltage in the low current state, and proportional to the cube of the voltage in the high current state, while the room temperature characteristics do not follow power laws in either state.

It appears the mechanism for double injection in the devices of the present invention is based on the presence of a deformation-produced, compensated region in the junction between the thin silicon film 6 and the epitaxially grown silicon layer 4, in which a high dislocation density provides recombination centers. It is also believed that the disorder of evaporated polycrystalline films accounts for the small diffusion length and the recombination centers required to account for the observed double injection and the negative resistance in our films. It should be understood, however, that the present invention is not necessarily predicated upon these postulates.

It has also been found that in the high current state there is a constant voltage region which is not a function of electrode area. In a typical case, two adjacent and otherwise identical diodes were disposed on a single silicon slice. Each had areas in the ratio of 4 to 1 but both displayed the same volt-ampere characteristic.

In the devices of the present invention, double injection appears to involve the injection of holes from the P-type silicon layer 4 into the thin silicon film 6 and the injection of electrons thereinto from the metallic contact member 8. Double injection occurs with the diode biased in the forward direction (that is, with a negative potential on the contact 8 to the thin silicon film 6). By reversing the polarity, the volt-ampere characteristic of a conventional reverse-biased PN junction diode is observed wherein only a single charge carrier current is present.

The bistable switching mode described above makes such two-element negative resistance devices as shown in FIGURES 1 useful as a computing element particularly for the memory or storage of information. Also because such double injection diodes can be fabricated on insulating substrates, as by initially forming the silicon substrate member 2 on sapphire, for example, noninteracting switching arrays can be built in matrix form. Furthermore, because of their demonstrated, exceptionally high photosensitivity when forwardly biased, the diode devices of the present invention are very useful in fields involving visible and infrared radiation. For example, the diodes of the invention can function as electronic relays, "driven" by electrically-driven light-producing elements. Also the post-breakdown constant voltage characteristic of the diodes of the invention makes them useful as voltage regulator elements at voltages lower than can be attained with conventional avalanche-mode (Zener) diodes.

Figure 2:
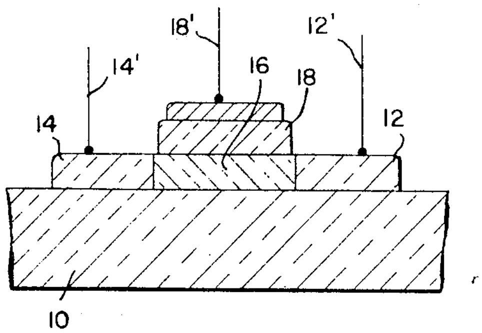
FIGURE 2 is a cross-sectional, elevational view of a three-terminal device according to the invention.

Referring now to FIGURE 2, a three-element double-injection device according to the invention is shown comprising an electrically insulating support substrate member 10 of sapphire, for example. Disposed on the insulating substrate is a crystalline semiconductor body which may be of silicon formed by the reduction of silicon hydride ($SiH_4$) conventionally referred to as heteroepitaxial growth. The silicon body may be about 1 to 2 microns thick, for example, and, as initially grown on the substrate 10, may be of P-type conductivity. The silicon body may be about 5 to 10 mils in length and width, for example.

A suitable mask against impurity diffusion such as may be constituted by a film of thermally grown silicon oxide is provided over a center portion of the silicon body leaving edge portions of the silicon body exposed. A P-type impurity may be diffused into these exposed edge portions to form P+ regions 12 and 14 with the original low resistivity silicon portion 16 laterally sandwiched therebetween. Such oxide masking diffusion techniques are well known in the art and reference is made to U.S. Patent No. 2,802,760 to Derick and Frosch and No. 3,025,589 to Hoerni for a complete detailed description thereof. By this processing, a region 16 of high resistivity (i.e., 2 to 5 ohm-cm.) is provided between regions 12 and 14 of low resistivity (i.e., .01 ohm-cm.). In this embodiment, the region 14 may be referred to as the drain region and the region 12 may be referred to as the source region.

After removal of the diffusion masking material, portions of the source and drain regions 12 and 14 are suitably masked and a thin film 18 of silicon may be vapor-deposited and formed on the high resistivity region 16. This film 18 may be formed by the same process as the thin film 6 in the embodiment of FIGURE 1. The final steps comprise forming a metallic contact 18' to the thin film 18 in a fashion similar to that for the contact 8 in the device of FIGURE 1, and attaching wires 12' and 14' as by thermocompression bonding, for example, to the source and drain regions 12 and 14, respectively.

Figure 5:
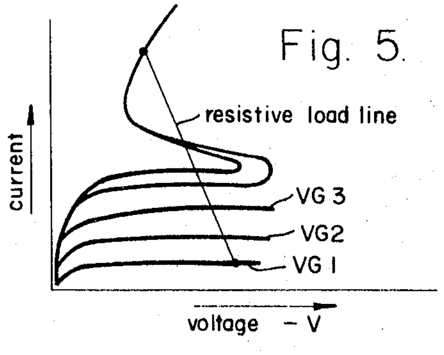

In this manner, a three-terminal device is provided exhibiting double injection and negative resistance. The device can be set and reset from a negative gate pulse and "memorizes the information" ("setting") given. With respect to the two-terminal device, the load circuit of the three terminal device of FIGURE 2 is independent of the input or trigger circuit. FIGURE 5 shows the current-voltage characteristic of a three-terminal negative resistance device according to the invention with various negatively-increasing gate voltage bias.

There thus has been shown and described a novel semiconductor device exhibiting double injection and negative resistance. As suggested previously, it will be understood that while P+, P, evaporated silicon structures have been described the utilization of N+, N, evaporated silicon structures is also feasible.

What is claimed is:

1. A thin film device exhibiting negative resistance comprising a single crystalline semiconductor layer of high electrical resistivity and of a predetermined type of conductivity, a thin film of polycrystalline semiconductor material disposed on a surface of said semiconductor layer, a semiconductor body of said predetermined type of conductivity disposed in contact with said semiconductor layer on a different surface thereof and of lower electrical resistivity than that of said semiconductor layer, and respective electrical contacts to said thin film and said semiconductor body for biasing said device in predetermined directions in one of which said device exhibits negative resistance.

2. The invention according to claim 1 wherein said semiconductor layer, said semiconductor body and said thin film are of silicon, and the resistivity of said semiconductor layer is from about 2 to about 5 ohm-centimeters.

3. A thin film diode comprising a semiconductor substrate member of low electrical resistivity and of predetermined conductivity type, a single crystalline semiconductor layer of high resistivity and of said predetermined type of conductivity disposed on said semiconductor substrate member, a thin film of polycrystalline semiconductor material disposed on said semiconductor layer, and respective electrical contacts to said thin film of semiconductor material and said semiconductor substrate member for biasing said diode in predetermined directions in one of which said diode exhibits negative resistance.

4. A thin film diode comprising a silicon substrate member of low electrical resistivity and of predetermined conductivity type, a single crystalline silicon layer of said predetermined conductivity type having a resistivity of from about 2 to about 5 ohm-centimeters disposed on said substrate member, a thin film of polycrystalline silicon disposed on said silicon layer, and respective electrical contacts to said thin film and said substrate member for biasing said diode in predetermined directions in one of which said diode exhibits negative resistance.

5. A thin film diode comprising a single crystalline silicon substrate member of low electrical resistivity and of P-type, a P-type single crystalline silicon layer having a resistivity of from about 2 to about 5 ohm-centimeters disposed on said substrate member, a thin film of polycrystalline silicon disposed on said silicon layer, and respective electrical contacts to said thin film and said substrate member for biasing said diode in predetermined directions in one of which said diode exhibits negatve resistance.

6. A thin film diode comprising a single crystalline silicon substrate member of low electrical resistivity and of predetermined conductivity type, an epitaxial layer of single crystalline silicon of said predetermined conductivity type having a resistivity of from about 2 to about 5 ohm-centimeters disposed on said substrate member, a vapor-deposited thin film of polycrystalline silicon disposed on said epitaxial layer, and respective electrical contacts to said thin film and substrate member for biasing said diode in predetermined directions in one of which said diode exhibits negative resistance.

7. A thin film triode device comprising an electrically insulating substrate member, a single crystalline semiconductor layer of predetermined conductivity type disposed on said substrate member and having a region of high electrical resistivity separating regions of lower electrical resistivity, a thin film of polycrystalline semiconductor material disposed on said region of said semiconductor of high electrical resistivity, and respective electrical contacts to said thin film and said regions of lower electrical resistivity for biasing said device in predetermined directions in one of which said device exhibits negative resistance.

8. The invention according to claim 7 wherein said semiconductor layer and said thin film are of silicon and the resistivity of said region of high electrical resistivity is from about 2 to about 5 ohm-centimeters.

9. A thin film triode device comprising an electrically insulating substrate member, a single crystalline epitaxial silicon layer of predetermined conductivity type disposed on said substrate member and having a region thereof of high electrical resistivity of from 2 to 5 ohm-centimeters separating in side-by-side fashion regions thereof of lower electrical resistivity, a thin film of polycrystalline material disposed on said region of high electrical resistivity, and respective electrical contacts to said regions of lower electrical resistivity and said thin film for biasing said device in predetermined directions in one of which said device exhibits negative resistance.

References Cited

UNITED STATES PATENTS

| | | | |
|---|---|---|---|
| 3,267,294 | 8/1966 | Dumke et al. | 317—235 X |
| 3,319,137 | 5/1967 | Braunstein et al. | 317—234 |
| 3,404,318 | 10/1968 | Lindmayer et al. | 317—234 |

JAMES D. KALLAM, *Primary Examiner.*

U.S. Cl. X.R.

29—569; 317—234